United States Patent [19]

Kataoka et al.

[11] 4,021,680
[45] May 3, 1977

[54] SEMICONDUCTOR DEVICE

[75] Inventors: Shoei Kataoka, Tanashi; Yasuo Komamiya, Yokohama; Mitsuo Kawashima, Tokorozawa; Nobuo Hashizume, Higashikurume; Kazutaka Tomizawa, Kamagaya, all of Japan

[73] Assignee: Agency of Industrial Science & Technology, Tokyo, Japan

[22] Filed: Oct. 1, 1975

[21] Appl. No.: 618,555

Related U.S. Application Data

[60] Division of Ser. No. 417,300, Nov. 19, 1973, abandoned, which is a continuation of Ser. No. 165,636, July 23, 1971, abandoned.

[30] Foreign Application Priority Data

Aug. 25, 1970 Japan .............. 45-73840

[52] U.S. Cl. .............. 307/216; 307/299 R; 357/3; 357/15; 357/19
[51] Int. Cl.² .............. H01L 47/02; H01L 27/26; H01L 31/16
[58] Field of Search .............. 357/3; 307/206, 252 E, 307/216, 299 R; 331/107 G

[56] References Cited

UNITED STATES PATENTS

| | | |
|---|---|---|
| 3,365,583 | 1/1968 | Gunn .............. 357/3 |
| 3,452,222 | 6/1969 | Shoji .............. 357/3 |
| 3,535,601 | 10/1970 | Matsukura et al. .............. 357/3 |
| 3,544,914 | 12/1970 | Suga .............. 357/3 |
| 3,597,625 | 8/1971 | Yanai et al. .............. 357/3 |
| 3,602,734 | 8/1971 | Matsukura et al. .............. 357/3 |
| 3,651,423 | 3/1972 | Sewell .............. 357/3 |
| 3,659,158 | 4/1972 | Shoji .............. 357/3 |
| 3,691,481 | 9/1972 | Kataoka et al. .............. 357/3 |
| 3,766,372 | 10/1973 | Kataoka et al. .............. 357/3 |
| 3,918,009 | 11/1975 | Claxton et al. .............. 357/3 |

OTHER PUBLICATIONS

Chang, IBM Tech. Discl. Bull., vol. 12, No. 1, June 1969, pp. 6–8.

*Primary Examiner*—William D. Larkins
*Attorney, Agent, or Firm*—Kurt Kelman

[57] ABSTRACT

Disclosed is a bulk semiconductor device which employs a semiconductor element exhibiting negative conductivity under a high electric field. Said semiconductor element has at least two regions and at least one bridge portion and each region thereof is connected with the region adjacent thereto by a bridge portion. Means for controlling the lateral spatial growth of a high electric field domain is provided on or near each bridge portion. The growth of a high electric field domain generated in one of the regions into the adjacent region is controlled by applying a signal to said controlling means.

15 Claims, 40 Drawing Figures

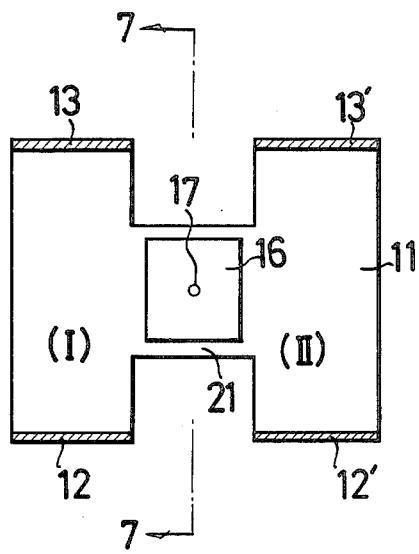
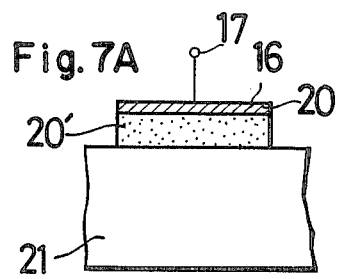
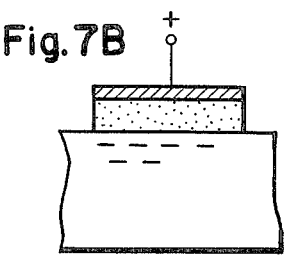
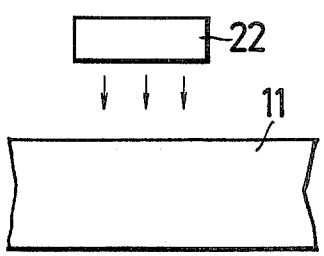
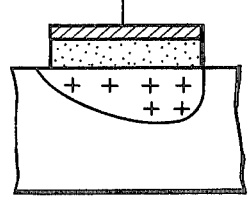
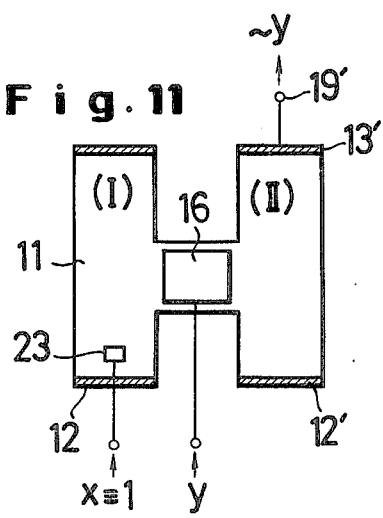

Current in Region(I)

Current in Region(II)

Fig. 10 (A)
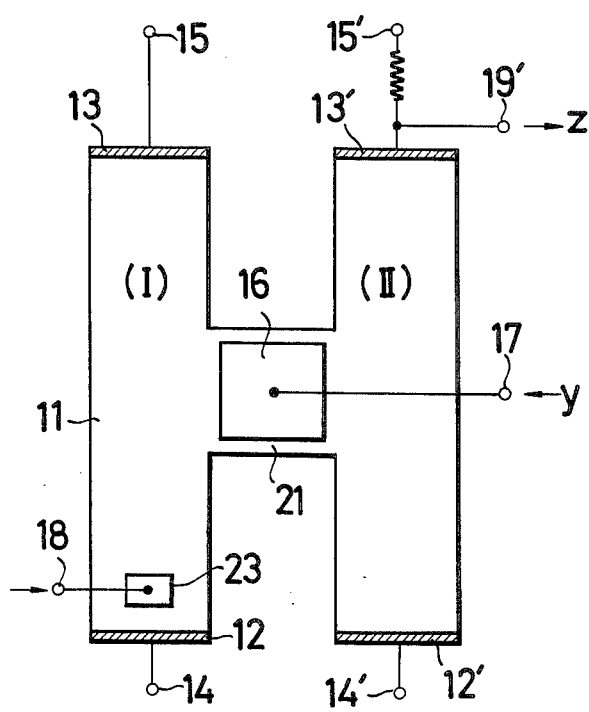
Fig. 12 (A)
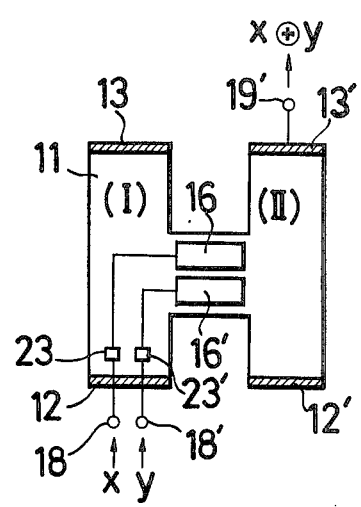
Fig 10 (B)
| x | y | z |
|---|---|---|
| 0 | 0 | 0 |
| 1 | 0 | 1 |
| 0 | 1 | 0 |
| 1 | 1 | 0 |
Fig. 12 (B)
| x | y | z |
|---|---|---|
| 0 | 0 | 0 |
| 1 | 0 | 1 |
| 0 | 1 | 1 |
| 1 | 1 | 0 |

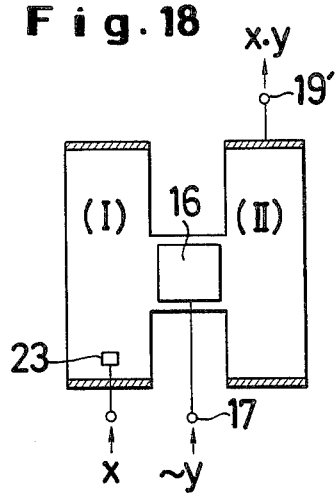
Fig. 18
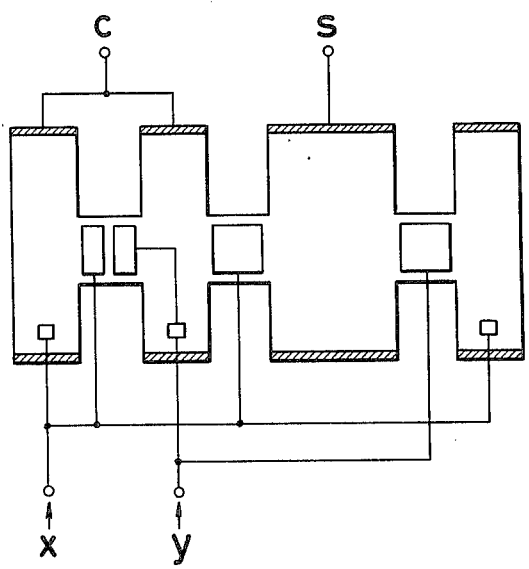
Fig. 19 (A)
Fig 19 (B)
| x | y | c | s |
|---|---|---|---|
| 0 | 0 | 0 | 0 |
| 0 | 1 | 0 | 1 |
| 1 | 0 | 0 | 1 |
| 1 | 1 | 1 | 0 |
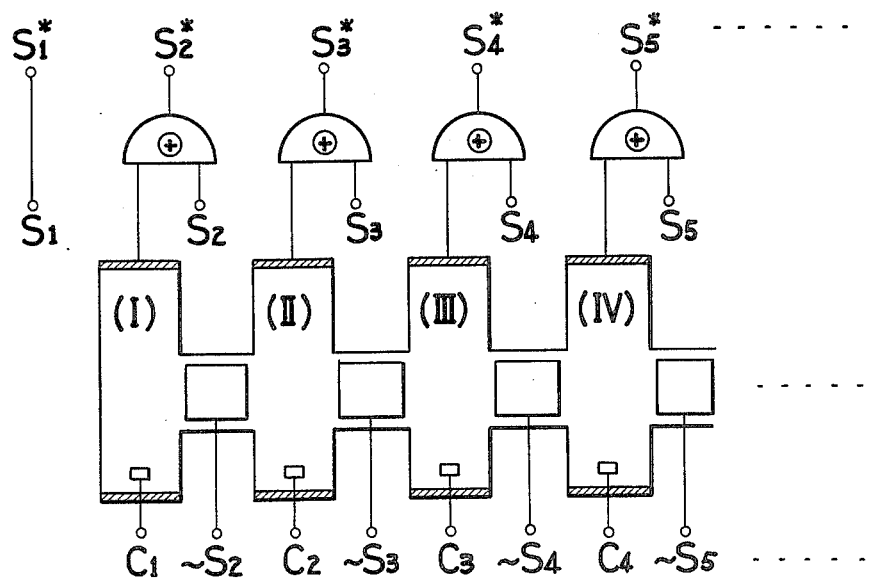
Fig. 20

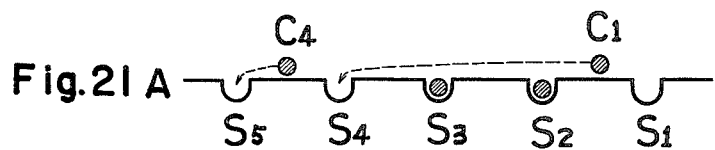
Fig. 21 A
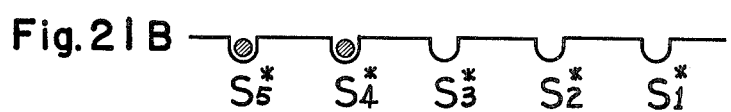
Fig. 21 B
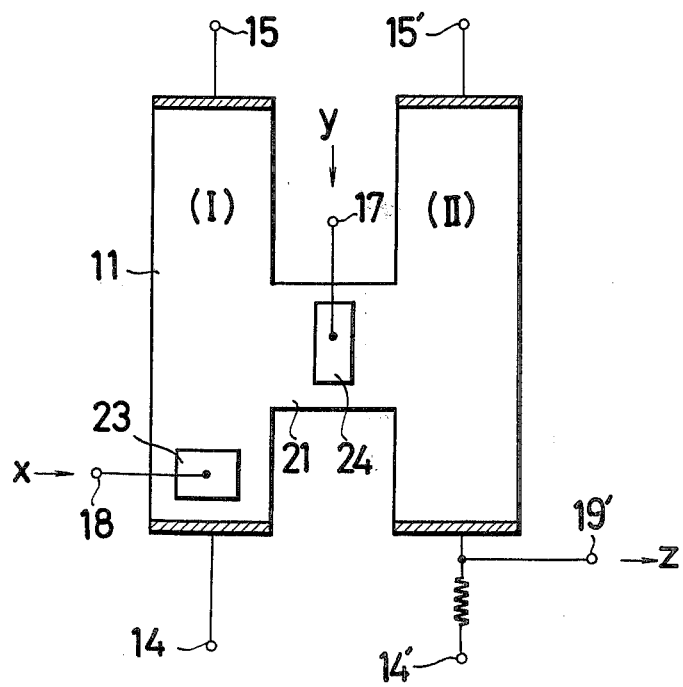
Fig. 22A
Fig. 22B
| x | y | z |
|---|---|---|
| 0 | 0 | 0 |
| 1 | 0 | 0 |
| 0 | 1 | 0 |
| 1 | 1 | 1 |

SEMICONDUCTOR DEVICE

REFERENCE TO RELATED APPLICATION:

This is a Divisional Application of our copending U.S. Patent Application Ser. No. 417,300 filed Nov. 19, 1973, now abandoned in favor of U.S. application Ser. No. 618,554, filed Oct. 1, 1975, and which was a continuation of Ser. No. 165,636, filed July 23, 1971 now abandoned.

The present invention relates to a bulk semiconductor device having means for controlling the growth of high electric field domain.

Recent electronic devices for use in information processing are required to have very high operation speed. However, in the conventional transistor using P-N junction structure, the operation speed is limited due to the capacitance inherent in such junction structure and the lifetime of injected carriers and the theoretical upper limit is considered as several GHz at most. With such value the time required to perform a logic operation is on the order of 1 nanosecond. In actual information processing, since a number of such semiconductor elements are connected in series to form a logic circuit, very long times are required to perform such logic operations as addition.

As for elements which can be operated at very high speed without limitation by a P-N junction, there is known the GaAs bulk semiconductor element which has negative conductivity at high electric field and provides an effect referred to as the Gunn effect wherein above a certain applied voltage a high electric field domain is generated in the vicinity of the cathode. This domain travels toward the anode to thereby provides a current oscillations. This semiconductor element itself is essentially a uniform N type semiconductor and the travelling velocity of the high electric field domain within a GaAs bulk semiconductor reacher $10^7$ cm/sec. Since the travelling speed of the domain is very high and thus the change in terminal current due to the generation and disappearance of such domains is very fast, such semiconductor is capable of responding to serveral hundred GHz and has therefore been utilized as an oscillation element for microwave or millimeter-wave and as a high speed logic element. The present inventors have previously invented a method for extinguishing a high electric field domain generated in such semiconductor element at any desired position before it reaches the anode thereof. Their earlier invention, made possible coupled with conventional methods for generating high electric field domains, several new kinds of very high speed logic operation circuits.

The primary object of the present invention is to provide a bulk semiconductor device having means for controlling a high electric field whereby a high electric field domain can be made to grow or be prevented from growing in the lateral direction at a certain region of semiconductor element.

Other objects, features and advantages of the invention will be apparent from the following more detailed description of preferred embodiments of the invention, as illustrated in the accompanying drawings.

Figure 5:
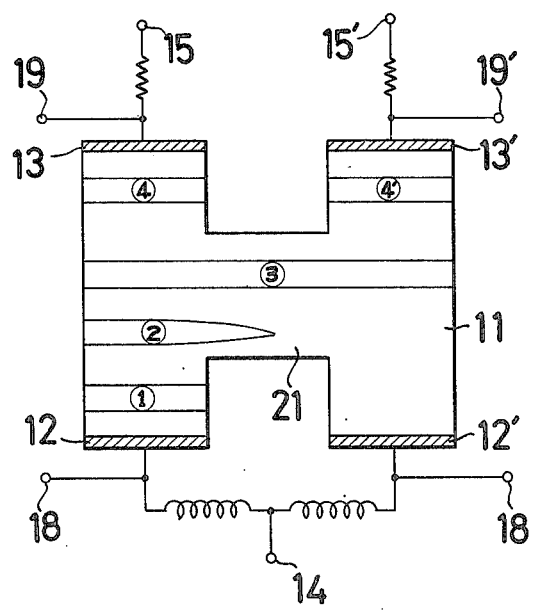
Figure 8A:
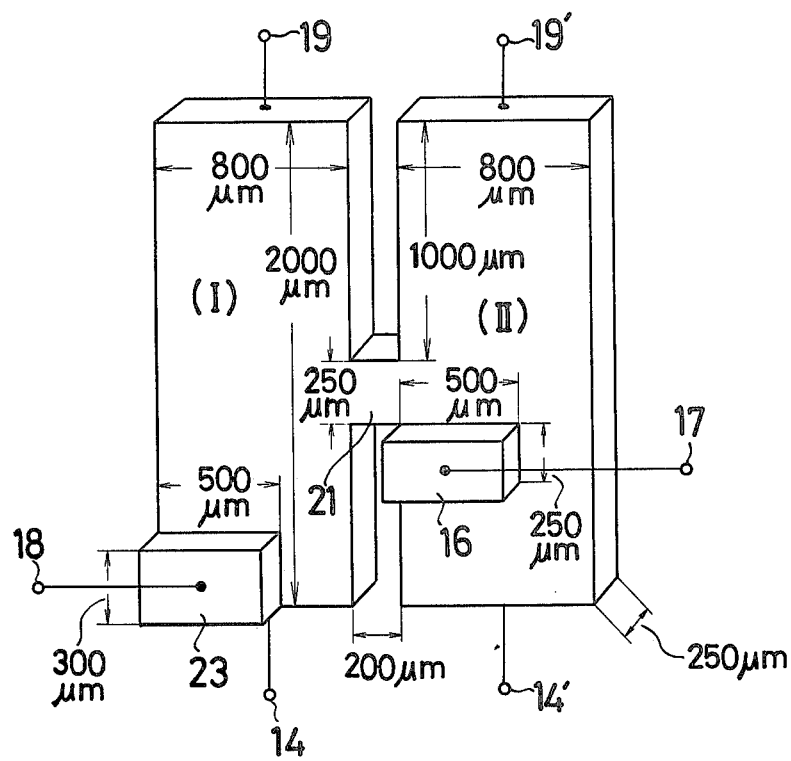
Figure 8B:
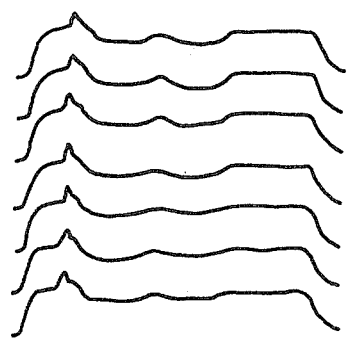
Figure 13:
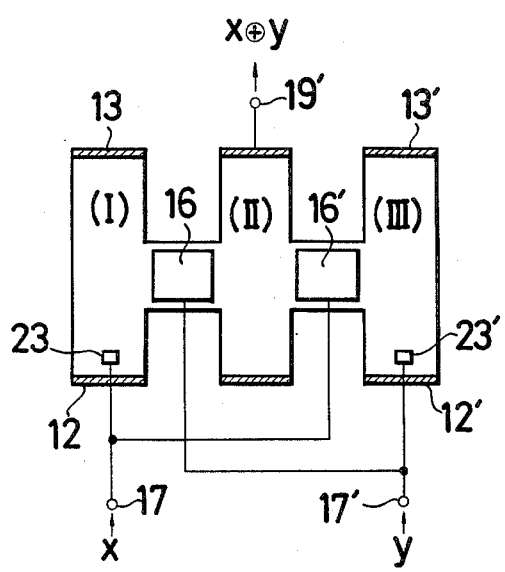
Figure 14:
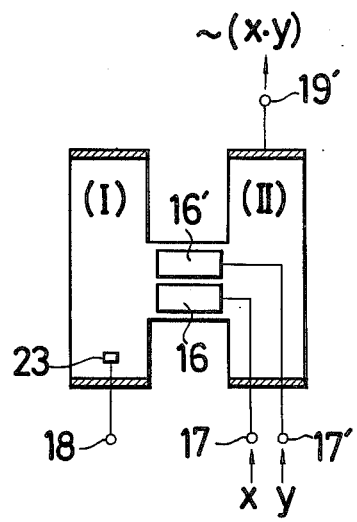
Figure 15:
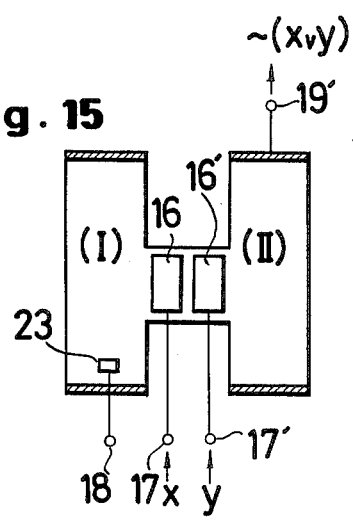
Figure 16:
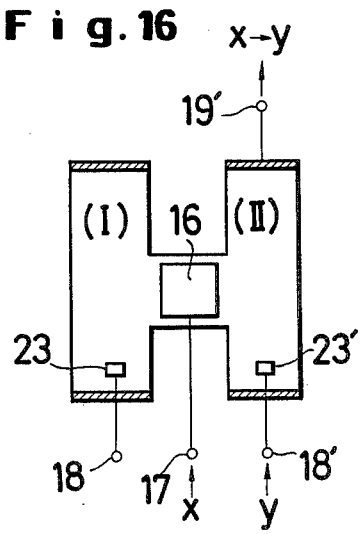
Figure 17:
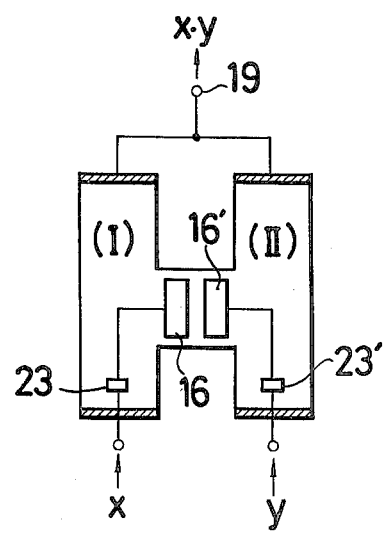
Figure 23:
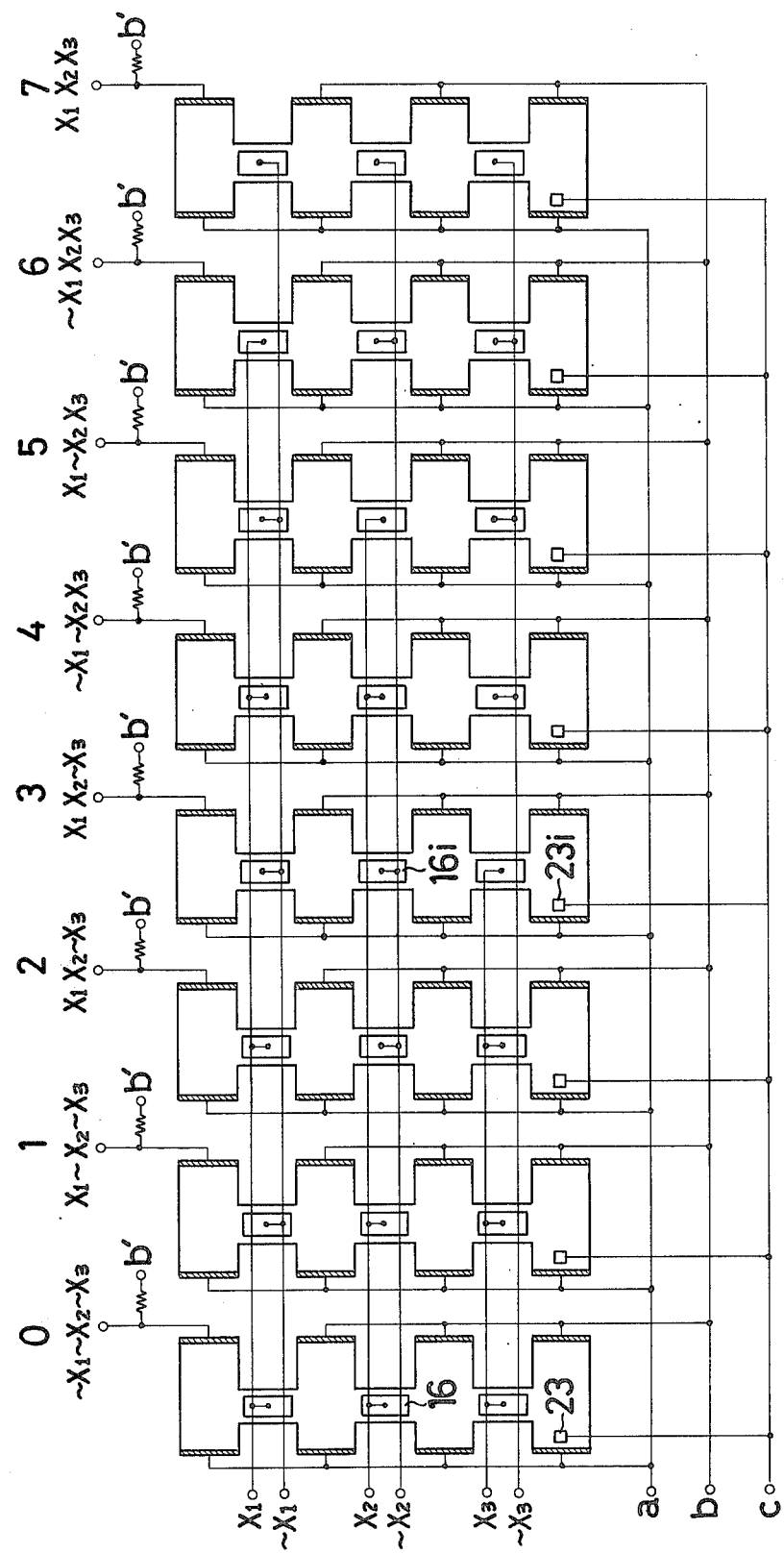
Figure 24:
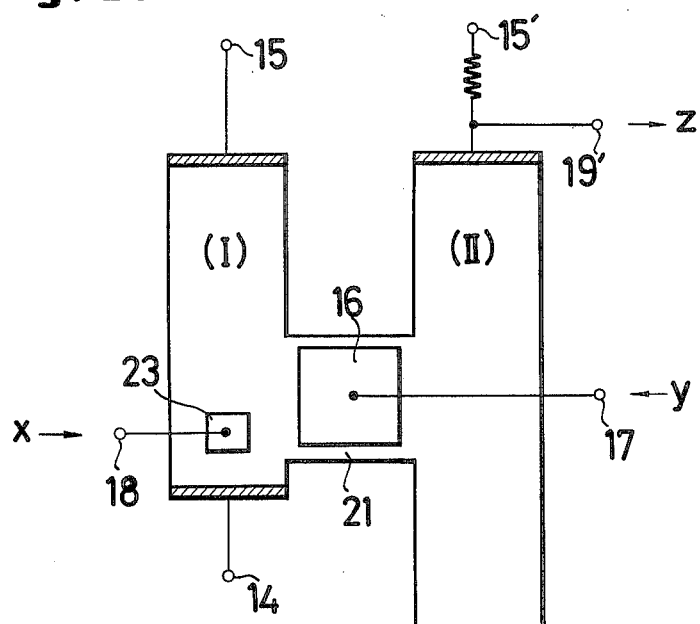
Figure 25:
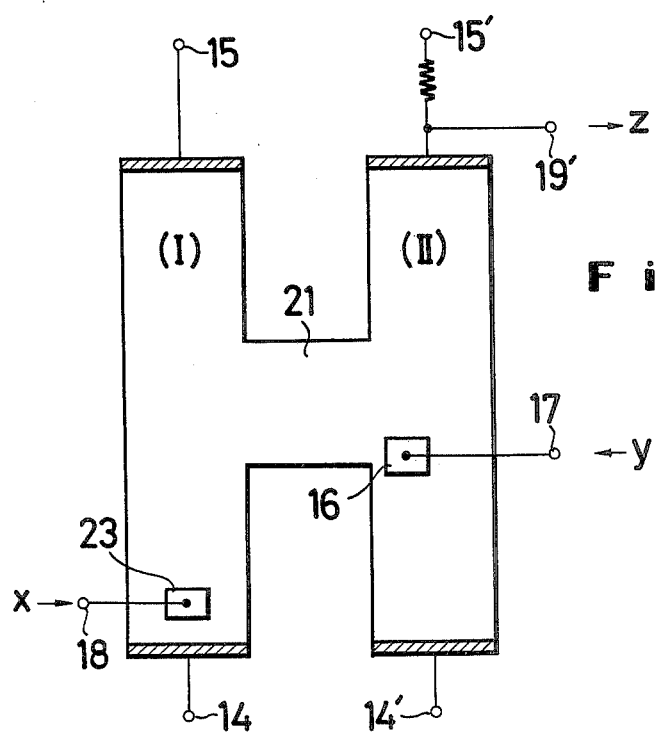

FIGS. 3 (A–D) and 4 (A–D) are illustrations explaining the growing process of space charges and a high electric field domain respectively in a seminconductor element;

FIG. 5 is an illustration of the spatial growth mechanism of the high electric field domain according to the present invention;

FIG. 6 shows an embodiment of an H-shape semiconductor element provided with a control electrode according to the present invention;

FIGS. 7 (A), (B) and (C) are crosssections taken along line 29—29 in FIG. 6;

FIG. 8(A) shows an experimental H-shape bulk semiconductor device;

FIGS. 8(B) and (C) show the result obtained in the experiment using the device in FIG. 8(A);

FIG. 9 is a modification of the device in FIG. 6, in which an optical means is used as the control electrode;

FIG. 10(A) is an embodiment of the present invention employed to perform a logic operation;

FIG. 10(B) is the truth table of the logic operation of the device in FIG. 10(A);

FIG. 11 is an embodiment of the present invention when it is used as a negation circuit;

FIG. 12 is an embodiment of the present invention when it is used to perform as EXCLUSIVE OR operation;

FIG. 13 is an embodiment of the present invention which is constructed by combining two basic devices in FIG. 10 to provide three regions;

FIGS. 14 and 15 show modifications of the device in FIG. 11, in which the control electrode is divided into two laterally and longitudinally disposed electrodes respectively;

FIG. 16 is another embodiment of the present H-shape bulk semiconductor device;

FIGS. 17 and 18 shown embidments for producing an AND operation with the basic device in FIG. 10;

FIG. 19(A) shows a half-adder constructed in accordance with the present invention;

FIG. 19(B) is the truth table obtained by the device in FIG. 19(A);

FIGS. 20 and 21 are embodiments for high speed carry, each of which includes a plurality of regions;

FIG. 22 shows an embodiment having a Schottky electrode as the control electrode provided on the bridge portion between the regions;

FIG. 22(B) is the truth table of an AND obtained with the device in FIG. 22(A);

FIG. 23 is a decoder using the construction in FIG. 10 for the AND operation; and FIGS. 24 and 25 are modifications of the present basic H-shape semiconductor element in FIG. 10.

Figure 1:
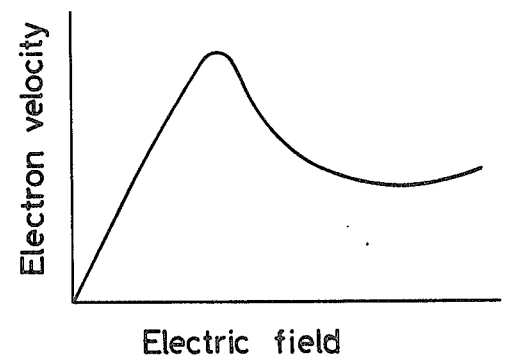
FIG. 1 is an illustration explaining the negative conductivity of a semiconductor element used in the present invention.
Figure 2:
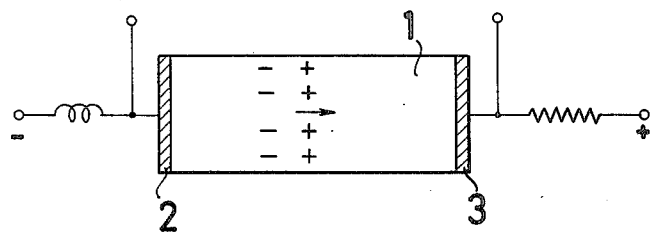
FIG. 2 shows a conventional bulk semiconductor element.
Figure 3A:
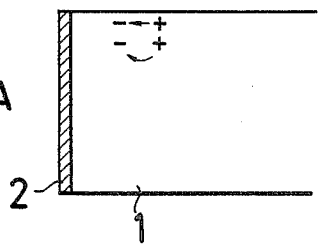
Figure 4A:
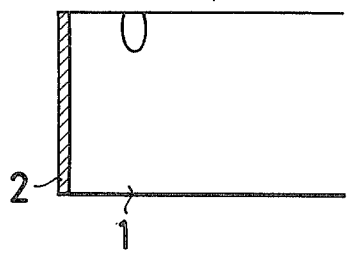
Figure 3B:
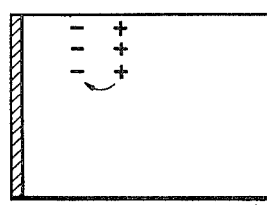
Figure 4B:
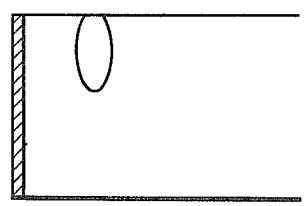
Figure 3C:
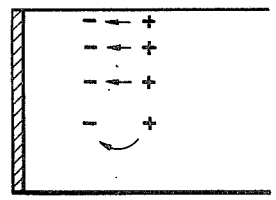
Figure 4C:
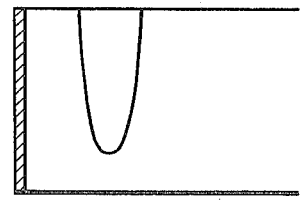
Figure 3D:
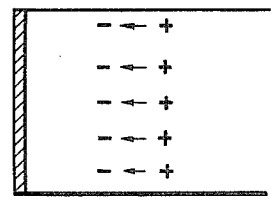
Figure 4D:
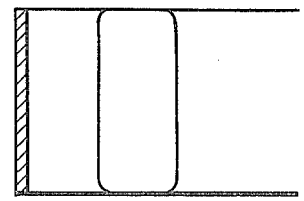

In a semiconductor such as GaAs and InP which has a negative conductivity at high electric field the average electron velocity is decreased at an electric field equal to or larger than its critical electric field as shown in FIG. 1. When a seminconductor 1 of this type is provided with ohmic electrodes 2 and 3 and a voltage above the critical value is applied therebetween as shown in FIG. 2, an accumulation of space charges builds up at a region where the internal electric field is at a relatively high level and thus a electric dipole layer is formed in the region, so that the electric field in the region becomes high enough to generate a high electric field domain. However, the accumulation of space charges and the resulting generation of a high electric field domain are not completed in the semiconductor instantaneously but the domain is generated through a process such as shown in FIGS. 3 and 4. However, the accumulation of space charges and resulting generation of a high electric field domain do not occur suddenly, but a process as shown in FIGS. 3 and 4 takes place. In an actual semiconductor, there always is fluctuation in carrier density or in geometry. Thus, there exists a local small part, where the electric field intensity is slightly higher than the other part of semiconductor. A nucleus of a high electric domain is produced in such a part, as shown in FIGS. 3(A) and 4(A) and developes gradually following to the sequences shown in FIGS. 3 and 4, which show space charge accumulations and electric high field respectively. As shown in FIG. 3(A), the leakage (shown by the bowed arrow) of the electric field generated by the initial space charge of such a nucleus acts to increase the electric field at the side thereof. As this phenomenon repeats itself, a uniform dipole layer is finaly generated in the semiconductor as shown in FIG. 3(D). Accordingly the process of the growth of high electric field domain becomes as shown in FIG. 4(A) to 4(D). This growth of the high electric field domain spreads not only in lateral direction but also in the direction of thickness. The time required to generate the high electric field domain is determined by the relaxation time of the semiconductor which is ordinarily $10^{-11}$–$10^{-12}$ seconds. The speed of transverse spreading of the high electric field domain is in the range of $10^8$–$10^9$cm/sec., which is faster than the travelling velocity of the high electric field domain ($10^7$cm/sec.) by one or two orders of magnitude in the case of GaAs.

The term "to control" used in this specification means to inhibit the lateral spatial growth of a high electric field domain, and to promote the lateral spatial growth of a high electric field domain.

An embodiment of the present invention will now be described with reference to the principle illustrated in FIGS. 5 and 6, which is a method for inhibiting and/or permitting a high electric field domain to generate in a certain region of a semiconductor by using the spatial growth of the high electric field domain in the lateral direction.

FIG. 5 shows an embodiment in which an H-shaped semiconductor element 11 exhibiting a negative conductivity is provided at the respective ends thereof with ohmic electrodes 12, 12', 13 and 13'. In this embodiment a DC bias voltage is applied to the terminals 18, 15 and 15', trigger signal voltage is applied to the terminal 14, and a high electric field domain 1 is generated in the vicinity of the left side cathode 12 of the element 11 and travels toward the anode 13. When the domain 1 reaches the bridge portion 21 of the element, it begins to grow in the lateral direction and spreads from 2 to 3. The domain 3 is further divided into left and right domain 4 and the domain 4' which reach the anodes 13 and 13', respectively. The present invention is intended to perform a logic operation by controlling of the lateral spatial growth of the domain, with a capacitive electrode or other means provided at a position of the element where the high electric field domain begins to grow in the lateral direction, as shown in FIG. 6.

FIG. 7 illustrates the function of the capacitive electrode for use in achieving the purpose. When no signal voltage is applied to a terminal 17 connected to an electrode 16 constituted with a metal 20 and an insulator 20' sandwiched between the metal 20 and a surface of the semiconductor 11 exhibiting negative conductivity, there is no considerable change in distribution of charge in the semiconductor as shown in FIG. 7(A). On the contrary when a positive signal voltage is applied to the terminal 17 the electrons in the semiconductor are attracted to the electrode and an accumulation of electrons occurs as shown in FIG. 7(B). Consequently the field intensity in the region under the capacitive electrode is weakened and thus the spreading of a high electric field domain in lateral direction is inhibited.

On the other hand when a negative voltage is applied to the terminal 17 an electron depletion layer is produced beneath the electrode as shown in FIG. 7(C) and the effective crosssectional area of the semiconductor is decreased. Accordingly, the electric field intensity at that portion is raised to promote the lateral spatial growth of the high electric field domain. Thus the lateral growth of the high field domain can be controlled by the voltage applied to the terminal 17.

An example of the performance of an H-shaped semiconductor element 11 such as shown in FIG. 8(A) is shown in FIGS. 8(B) and (C).

The H-shaped device was made from n type GaAs with a carrier concentration of $3 \times 10^{13}$ cm$^{-3}$ and an electron mobility of 8000 cm$^2$/Vs. The device has four ohmic electrodes prepared by evaporation and alloying of Au-Ge at each end. Two capacitive electrodes were prepared on the surface of the GaAs by attaching silver-evaporated BaTiO$_3$ sheets with epoxy resin; one as a generating electrode 23 near the cathode in the left hand region (I), and the other as a control electrode 16 near the bridge portion 21 in the right hand region (II).

The generating electrode 23 is to generate a high electric field domain in region (I) and the control electrode 16 is to control the lateral spreading of the domain into region (II).

Bias-voltage pulses of 580 V and 35 ns duration were simultaneously applied to the anodes of both regions. A signal-voltage pulse of 100 V as signal "x" was applied 5 ns after the application of the bias pulse for both the presence and absence of the control-voltage pulse, of 102 V which was, for convenience, chosen to be of nearly the same duration as the bias voltage pulse. The bias-voltage pulse amplitude was adjusted between the sustaining and the threshold voltages, so that the device always operated in the triggered mode.

If the potential of the control electrode 16 is fixed to zero (the same potential as the cathode) during the bias-voltage pulse application, a depletion layer is formed in the GaAs under the control electrode 16 located near the bridge portion 21. This depletion layer raises the electric field in GaAs near the bridge portion 21 and thus lets the generated high electric field domain in region (I) spread laterally into region (II) as the domain reaches the bridge portion 21. If the potential of the control electrode 16 is fixed to a certain positive value, on the other hand, the depletion layer under the control electrode 16 decreases in size to reduce the electric field in the GaAs near the bridge portion 21 so that the triggered domain in region (I) may not spread into region (II).

Figure 8C:
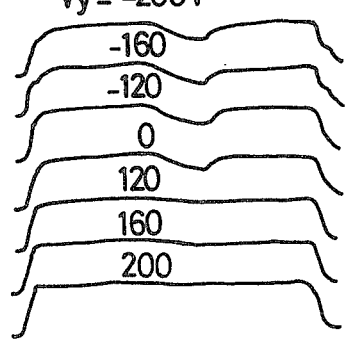

Current waveforms in regions (I) and (II) observed through 50Ω monitor resistors connected in series with the cathodes, are shown in FIGS. 8(B) and 8(C), respectively, for various control voltages. The transit time of a domain across the cathode and the anode in region (I) is about 20 ns. A current spike in FIG. 8(B) represents a domain generating pulse, and that the current increases slightly when the domain is passing by the bridge portion 21 owing to the wider crosssection. As seen from the current waveforms in region (II) shown in FIG. 8(C), the presence of a high electric field domain in region (II) is observed when the control voltage $V_y$ is negative. With increasing the control voltage $V_y$ the domain potential in region (II) gets smaller: and finally positive value of the control voltage, the domain in region (I) does not spread into region (II), as the current in region (II) remains almost constant during the domain propagation in region (I).

From FIGS. 8(B) and 8(C) it is clear that when the control voltage is higher than a certain value the current in the region (II) disappears showing the inhibiting of the high electric field domain to be spread into the region (II).

Further, the lateral spatial growth of the high electric field domain can also be controlled by irradiating a desired portion of the semiconductor with light or the like. FIG. 9 shows an embodiment using such irradiation in which a light source as light emitting element 22 is located adjacent to one surface of the semiconductor 11 and a light emitted from the light emitting element 22 upon an electrical signal irradiates the semiconductor. Carriers are produced in the irradiated area and they act to lower the electric field intensity in that area to thereby inhibiting the lateral growth of the high electric field domain.

Since the spatial growth of high electric field domain can be controlled by electrical signals in the described manners, they have applications in various logic operations or the like at considerably high operation speed.

FIG. 10 shows the basic construction of a bulk semiconductor device adapted to perform logic operations in accordance with the above described principle. The semiconductor per se takes the form of an H-shaped structure and is provided at the respective ends with ohmic electrodes 12, 12' and 13, 13' to which DC voltages are applied. In this arrangement, the electrodes 12 and 12' serve as cathodes to which terminals 14 and 14' are connected respectively and the electrodes 13 and 13' serve as anodes to which terminals 15 and 15' are connected respectively. On the surface of the semiconductor a generating electrode 23 for generating a high electric field domain in the semiconductor 11 by a signal (which may be an ohmic, non-ohmic or capacitive electrode or may be, for example, MOS or Schottky barrier) is provided adjacent to the cathode 12 to which a terminal 14 is connected. In addition, a control electrode 16 is provided on or near the bridge portion 21 between the left side region (I) and the right side region (II) of the H-shaped semiconductor 11 which acts to control the lateral spatial growth of a high electric field domain into the region (II) and to which a terminal 17 is connected. An output terminal 19' is connected to the anode 13'.

DC bias voltages are applied between the electrodes 12 and 13 and between the electrodes 12' and 13', respectively, the values being adjusted in such a manner that on terminal 14 they are slightly lower than the threshold voltage at or above which a high electric field domain is generated. Under these conditions, when a signal is applied to the terminal 14 a high electric field domain is generated in the vicinity of the electrode 23. The following are methods for performing various logic operation using this arrangement.

The most fundamental operation of this semiconductor device is to obtain an output "z " from the output terminal 19' by applying a signal "x" to the generating terminal 18 and another signal "y" to the control terminal 17. Upon the application of the signal "x " to the terminal 18, a high electric field domain is generated in the region (I) of the semiconductor and upon the application of the signal "y" to the terminal 17 the lateral spatial growth of the domain into the region (II) is inhibited. The relationship between these input signals "x", "y" and output signal "z" is represented in the truth table in FIG. 10 and this performs a logic operation of $z = x \cdot \sim y$.

Since the above is a modification of Sheffer's stroke, almost all kinds of logic operation can be performed by combining $x \cdot \sim y$.

FIG. 11 shows an example of negation circuit in which a negation of "y" is obtained as the output if the constant signal of 1 is applied to the electrode 23 as "x".

In FIG. 12 a pair of high electric field domain generating electrodes 23 and 23' are provided on the region (I) of the semiconductor in the vicinity of the cathode thereof and the input signals "x" and "y" are applied to terminals 18 and 18' connected to the generating electrodes 23 and 23' respectively. In the bridge portion 21 between the regions (I) and (II) are provided a pair of electrodes 16 and 16' for controlling the lateral spatial growth of a high electric field domain, the electrodes 16 and 16' being connected in parallel to the electrodes 23 and 23'.

The electrodes 16 and 16' are located along the spatial growth direction of the domain, for example, as shown in FIG. 12(A) so that when a signal is applied to either of the control electrodes 16 and 16', the inhibition of the lateral spatial growth of high electric field domain from the region (I) to the region (II) does not occur, while when the both electrodes receive signals simultaneously the inhibition effect is obtained.

With this arrangement, when the input signals "x" and "y" are applied to the terminals 18 and 18' respectively, the current in the region (II) is changed due to the presence of high electric field domain in the region (II) and the change in current is detected on a detection terminal 19.

The output signal "z" is as in the truth table in FIG. 12(B), representing logic operation of EXCLUSIVE OR, given by $z = x + y$.

FIG. 13 shows an arrangement which is equivalent to a combination of two of the basic devices shown in FIG. 10, in which the semiconductor comprises regions (I), (II) and (III) and the electrodes 16 and 16' for controlling the lateral spatial growth of high electric field domain are provided at the bridge portions 21 connecting the regions. The electrodes 23 and 23' for generating high electric field domains are provided in the vicinities of the cathodes 12 and 12' of the regions (I) and (III) respectively and are connected respectively to the control electrodes 16 and 16' disposed on the bridge portions 21 between the regions (II) and (III) and between the regions (I) and (II) respectively. The input terminals 17 and 17' are led from the connections of the electrodes 23 and 16' and the electrodes 23' and 16 respectively. In this arrangement, the output signal "z" obtainable at the terminal 19' as the change in current flowing in the region (II) when the input signals "x" and "y" are applied to the terminals 17 and 17' respectively becomes as in FIG. 12(B), resulting in an EXCLUSIVE OR logic operation represented by $z = x + y$.

FIG. 14 shows another embodiment similar to that shown in FIG. 11 except that the construction in FIG. 14 includes a pair of control electrodes 16 and 16' which are connected to the terminals 17 and 17' while FIG. 10 shows only a single control electrode 16, (the electrodes 16 and 16' are considered as divided from the single electrode in FIG. 11), and in which a constant input is always applied to the domain generating electrode 23 to maintain a high electric field domain generating. In this arrangement, when an input signal is applied to either of the terminals 17 and 17', the domain growth inhibiting effect does not occur, while only when input signals are applied to the terminals 17 and 17' at the same time is the growth of the high electric field domain from the region (I) to the region (II) of the semiconductor inhibited. Accordingly, in the latter case, there is provided a relation between the input singals "x" and "y" applied to the terminals 17 and 17' and the output signal "z"obtained at the terminal 19' given by $z = \sim (x \cdot y)$ which is a NAND operation.

FIG. 15 shows another embodiment which is similar to that shown in FIG. 14 but different in arrangement of the control electrode 16 and 16' in that the example in FIG. 14 comprises a pair of control electrodes disposed along the spatial growth of a high electric field domain in the bridge portion between the regions (I) and (II) while the example in FIG. 15 comprises a pair of electrodes disposed at right angles to the lateral spatial growth of a high electric field domain in the same portion. In the arrangement in FIG. 15 the lateral spatial growth of a high electric field domain generated in the region (I) to the region (II) is inhibited either when a signal is applied to only one of the terminals 17 and 17' or when signals are applied to both of the terminals 17 and 17' and therefore there is provided a relation between the inputs "x" and "y" applied to the terminals 17 and 17' and the output "z" obtained at the output terminal 19', given by $z = \sim (x \vee y)$ which is a NOR operation.

FIG. 16 is an embodiment which is contructed by modifying the construction of FIG. 11 in such a manner that an additional electrode 23' for generating a high electric field domain is provided in the vicinity of the cathode in the region (II) to obtain an output representing "x" to "y" conversion by applying the signal "x" to the control electrode 16 and the signal "y" to the electrode 23' and to thereby perform an logic implication operation.

FIGS. 17 and 18 are embodiments constituted with the fundamental arrangement in FIG. 10 to perform and AND operation. In FIG. 17 when a signal "x" or "y" is applied, a high electric field domain is generated in the region (I) or (II) and when both of the signals "x" and "y" are applied two high electric field domains are generated in both the regions (I) and (II) to increase the output level twice the output under the former condition. When this increased output level is designated by 1 an AND operation can be performed.

The embodiment in FIG. 18 is similar to that shown in FIG. 10 but different in that a signal " $\sim y$ " is applied beforehand to the terminal 17 to perform and AND operation.

By combining the fundamental arrangements described heretofore for various fundamental logic operations, an adder can be constructed. FIG. 19 is an embodiment of half-adder in which a carry "C" of the inputs "x" and "y" and a sum "S" of them are obtained and the truth table therefore is as in FIG. 19(B).

FIG. 20 is an embodiment of a high speed carry device which is constructed with a plurality of semiconductor regions (I), (II), (III), . . . . (N) which number corresponds to the number of digits and is provided with a control electrode for controlling the lateral spatial growth of high electric field domain on each of the bridge portions between the adjacent regions. In FIG. 20 the symbol $S_i$ represents the sum of the ith digit of the half-adder and $\sim S_i$ is a negation signal of $S_i$. The symbol $C_i$ repesents a carry in the ith digit of the half-adder. Where the presence of a high electric field domain in each region is represented by 1 and the output from the $(i - 1)$th region is represented by $C_{i-1}$, the result of sum in each digit position can be represented as follows: $S_i^* = C_{i-1}^* + S_i$ Since when $C_i$ is 1, $\sim S_i$ is always 1, the high electric field domain never growingly spreads from right to left.

The operation of this device now will be described. As an example it is assumed that the sum of $X = 1111$ and $Y = 1001$ is desired. With the half-adder, the sum signal and the carry signal for each digit are as follows:

```
X  1111
Y  1001
S  0110
C  1001
```

Explaining this with reference to FIG. 21(A), if it is assumed that a ball representative of a carry $C_1$ passing over recesses $S_2$ and $S_3$ representative of sums, causes the recesses $S_2$ and $S_3$ to disappear, the ball C will enter into recesses $S_1^*$ and the ball $C_4$ will enter into a recess $S_5^*$, and consequently the following is obtained.

```
X       1111
Y       1001
answer  11000
```

Explaining this with reference to FIG. 20, since $\sim S_2$ and $\sim S_3$ are 0 the domain due to $C_1$ can grow to the regions (II) and (III) of the semiconductor. However, since $\sim S_4$ is 1 the growth of this domain from the region to the right is inhibited. Furthermore, since $C_4$ is 1 a high electric field domain can exist in the region (N). However, since $\sim S_5$ is 1 this domain cannot grow toward the region (V). That is, the high electric field domain can exist only in the regions (I), (II), (III) and (IV). It is assumed that the output signals obtained from the respective regions are represented by $C_1^*$, $C_2^*$, $C_3^*$ and $C_4^*$. On the other hand, for $S_i$, respective $S_2$ and $S_3$ are 1. Accordingly, $$S_i^* = C_{i}^* + S_i \text{ where } S_1^* = S_1$$

and the relation therebetween becomes as in FIG. 22(B) which is precisely the previous result.

It should be noted that, while in each embodiment described the high electric field domain generating electrode is provided in the vicinity of the cathode in the region (I) of the semiconductor, such a domain generating electrode is not always required in order to generate a high electric field domain by an external signal. For example the high electric field domain can be generated by applying an input signal directly to the cathode or anode to raise the field intensity at that portion higher than the threshold value required to generate a domain. The output, i.e., whether a high electric field domain exists or not, may be detected by providing a high electric field domain detecting electrode.

In the previous embodiments, the high electric field domain control electrode has been described as having the function of inhibiting the lateral spatial growth of the high electric field domain, that is, the method of use such as shown in FIG. 7(B). It should be noted, however, that substantially the same result can be obtained by utilizing the effect of the promotion of lateral growth of high electric field domain due to the control electrode as in FIG. 7(C). For example, in the construction shown in FIG. 10, the thickness and/or the electrical properties of the semiconductor and/or the DC bias voltage are so selected that the high electric field domain generated in the region (I) is inhibited from growing laterally into the region (II) when no signal is applied to control electrode 16 and permitted to grow into the region (II) when a signal is applied to the control electrode 16. In this case, the relation between the input signals "$x$" and "$y$" and the output signal "$z$" becomes as in the truth table shown in FIG. 22(B), performing an AND operation.

Further, when this method of use is employed in the construction of FIG. 14, an OR operation can be performed and when employed in the construction in FIG. 15 an AND operation is performed. In these embodiments of FIGS. 14 and 15, a steady voltage is applied to the generating electrode 23 to generate a high electric field domain, and two input signals, "$x$" and "$y$" are applied to the control electrodes 16 and 16', respectively. In the high speed carry device shown in FIG. 20, since the input signal to be applied to the respective control electrode may be $S_i$ rather than $\sim S_i$ when the function of the control electrode is made to promote the lateral spatial growth of the high electric field domain, the construction of the adder is considerably simplified.

An embodiment of the present invention is shown in FIG. 22 in which the generating electrode 23 is provided near the cathode 12 in the region (I) and the Schottky electrode 24 is provided in the bridge portion 21 of the regions. The bias voltages for the respective regions are maintained at slightly lower than the threshold voltage required to generate a high electric field domain therein. The domain in region (I) which is generated upon the application of a trigger signal to the generating electrode 23, travells toward its anode 11. If in this case no signal is applied to the Schottky electrode 24 provided on the bridge portion 21, the domain cannot grow into the region (II) because the field intensity under the gate electrode 23 is low. However, when a negative voltage is applied to the Schottky electrode 24, the high electric field domain in the region (I) grows into the region (II) easily because the electron depletion layer is produced due to the negative voltage, so that the short-circuit effect due to the metal disappears and thus the field intensity at that portion is increased. Consequently, the regions (I) and (II) have high electric field domains respectively and the respective domains move toward the respective anodes 13, 13'. Accordingly, where the change in current flowing through the region (II) is derived from the terminal 19 as the output "$z$", a relation such as shown in FIG. 22(B) is obtained between the output "$z$" and the signal "$x$" to the generating electrode 23 and the signal "$y$" to the control electrode 24, performing and AND operation.

The same function as that of the Schottky electrode can be obtained by inserting a resistive layer between the semiconductor and the electrode.

In this embodiment, any method can be employed for generating a high electric field domain and, as examples, it can be generated by applying a negative voltage to the cathode, applying a positive voltage to the ohmic trigger electrode provided near the cathode, applying a negative voltage to a capacitive electrode provided near the cathode.

FIG. 23 shows a modification of the embodiment in FIG. 10 which performs an AND operation wherein the construction shown in FIG. 10 is extended somewhat in the lateral direction to provide a construction which can additionally perform the function of a decoder.

In this example, which is for three bits of information, the high electric field domain generating electrode 23 is provided only the region positioned at the left most end and a high electric field domain generated at the portion grows in lateral direction to reach the right most end and provides an output signal only when its lateral spread is not inhibited by any of the control electrodes 16 provided on the right side relative to the electrode 23. With this arrangement a decoder is realized which derives selectively any desired one of a plurality of bits at a very high speed. In the embodiments shown in FIGS. 10 to 23, a distance in the longitudinal direction is provided between the generating electrode 23 and the control electrode 16 for convenience of explanation. It should be noted, however, that the operation speed can be increased by providing the two electrodes adjacently as shown in FIG. 24. That is, the shorter longitudinal distance between the electrodes 16 and 23 provides higher operation speed. It should be further noted that the controlling electrode need not always be provided at the bridge portion 21 between the two regions. It may be provided in the vicinity of that portion with substantially the same effect as shown in FIG. 25.

As described in detail, according to the present invention logic operations or addition can be performed at substantially higher speed than in any conventional semiconductor device by providing a control means on the semiconductor to control the generation of a high electric field domain in the semiconductor.

The present invention makes a substantial contribution to the electronic industry in that it can be produced from such a semiconductor material as GaAs and InP by using integrated circuit technology to prepare an epitaxial layer in the required pattern and thus provides a device which, being of much simpler construction and being capable of performing much more complex function at extremely high speed than heretofore known semiconductor devices, is applicable with great advantages to electronic computers and other information processing machines.

What is claimed is:

1. A bulk semiconductor device comprising a semiconductor element exhibiting a negative conductivity under a high electric field, said semiconductor element having at least two regions and at least one bridge portion, each said regions having two ohmic electrodes at the opposite ends thereof and being connected with the region adjacent thereto by a bridge portion, at least one means provided on at least one of said regions for generating a high electric field domain, means provided on or near each said bridge portion for selectively controlling the lateral spatial growth of a high electric field domain generated in one of the regions connected therewith into the other regions connected therewith responsive to a control signal supplied thereto, and means for detecting the existence of a high electric field domain in said other region.

2. The bulk semiconductor device according to claim 1, wherein said controlling means is an electrode provided on or near said bridge portion of said semiconductor element.

3. The bulk semiconductor device according to claim 2, wherein said electrode is a capacitive electrode having an insulating material disposed between a metal thereof and said semiconductor element.

4. The bulk semiconductor device according to claim 2, wherein said electrode is a Schottky electrode.

5. The bulk semiconductor device according to claim 2, wherein said electrode is an electrode having a resistive layer disposed between a metal thereof and said semiconductor element.

6. The bulk semiconductor device according to claim 1, wherein said controlling means is a light emitting element.

7. The bulk semiconductor device according to claim 2, wherein said electrode is divided into two parts.

8. The bulk semiconductor device according to claim 7, wherein said two parts of the electrode are disposed along the lateral spatial growth direction of a high electric field domain at said bridge portion.

9. The bulk semiconductor device according to claim 7, wherein said two parts of the electrode are disposed at angles to the lateral spatial growth direction of a high electric field domain in said bridge portion.

10. The bulk semiconductor device according to claim 1, wherein said semicondutor element has at least three regions and each region is connectd with the region adjacent thereto by one bridge portion.

11. The bulk semiconductor device according to claim 2, wherein said electrode is electrically connected to said generating means.

12. The bulk semiconductor device according to claim 1, wherein the number of generating means provided on said at least one region is two and said controlling means is divided into two parts each of which is electrically connected to one of said generating means, whereby a high electric field domain generated by a signal applied to one of said generating means is permitted to grow into said adjacent region and the high electric field domain generated by a signal applied to both of said generating means is not permitted to grow into said adjacent region.

13. The bulk semiconductor device according to claim 1, wherein the number of regions is three, only the two nonadjacent regions are provided with generating means and each of said generating means is electrically connected with the controlling means on or near the bridge portion connected with the region wherein the other generating means is located, whereby the high electric field domain generated by a signal applied to either of said generating means is permitted to grow into the adjacent region and the high electric field domains generated by signals applied to both of said generating means are not permitted to grow into the adjacent region.

14. The bulk semiconductor device according to claim 1, wherein the number of regions is two, each region has one generating means and the controlling means is divided into two parts each of which is electrically connected to one of said generating means, whereby the high electric field domain generated by a signal applied to the generating means in either of said regions is permitted to grow into the other of said regions and neither of the high electric field domains generated by signals applied to both of said generating means is allowed to grow into the other region.

15. The bulk semiconductor device according to claim 1, wherein the number of regions is four, the first, second and fourth regions are provided with generating means, the controlling means at the bridge portion connecting the first and second regions is divided into two parts, the generating means of the first region, one part of the controlling means at the bridge portion between the first and second regions, the controlling means at the bridge portion between the second and third regions and the generating means of the fourth regions are electrically connected to each other and to a first terminal, the other half of the controlling means at the bridge portion between the first and second regions, the generating means of the second region and the controlling means at the bridge portion between the third and fourth regions are connected to each other and to a second terminal, the ohmic electrodes of the first and second regions at the end opposite the ends provided with generating means are electrically connected with each other and to a third terminal and the ohmic electrode at one end of the third region is connected with the fourth terminal, whereby there is obtained a half-adder.

* * * * *